(12) United States Patent
Inada et al.

(10) Patent No.: US 6,538,306 B1
(45) Date of Patent: Mar. 25, 2003

(54) ELECTRONIC PART

(75) Inventors: Shinichi Inada, Kyoto (JP); Masahide Maeda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/019,391

(22) PCT Filed: Jun. 30, 2000

(86) PCT No.: PCT/JP00/04385

§ 371 (c)(1),
(2), (4) Date: Dec. 28, 2001

(87) PCT Pub. No.: WO01/03184

PCT Pub. Date: Jan. 11, 2001

(30) Foreign Application Priority Data

Jul. 2, 1999 (JP) .......................................... 11-188534

(51) Int. Cl.[7] ............................................. H01L 23/495
(52) U.S. Cl. ..................... 257/666; 257/692; 257/694; 257/676
(58) Field of Search .......................... 438/123; 361/813; 257/735, 739, 692, 694, 696, 666, 676, 672, 669, 674

(56) References Cited

U.S. PATENT DOCUMENTS

| | | | | |
|---|---|---|---|---|
| 4,794,431 A | * | 12/1988 | Park ........................... | 257/676 |
| 5,298,768 A | * | 3/1994 | Okazaki et al. .............. | 257/81 |
| 5,438,021 A | * | 8/1995 | Tagawa et al. ............... | 438/125 |
| 5,479,050 A | * | 12/1995 | Pritchard et al. ............ | 257/670 |
| 5,489,800 A | * | 2/1996 | Brown et al. ................. | 257/666 |
| 5,530,284 A | * | 6/1996 | Bailey ......................... | 257/670 |
| 5,739,582 A | * | 4/1998 | ElHatem et al. .............. | 257/676 |

FOREIGN PATENT DOCUMENTS

| | | | |
|---|---|---|---|
| JP | 63-43465 | 3/1988 | |
| JP | 63-260155 | * 10/1988 | .................. 257/772 |
| JP | 1-125559 | 8/1989 | |
| JP | 1-278031 | * 11/1989 | .................. 257/676 |
| JP | 4-137064 | 12/1992 | |
| JP | 5-90643 | * 4/1993 | .................. 257/99 |
| JP | 05-315493 | 11/1993 | |
| JP | 6-53554 | * 2/1994 | .................. 257/100 |
| JP | 06-104359 | 4/1994 | |
| JP | 6-204569 | * 7/1994 | .................. 257/99 |
| JP | 07-307424 | 11/1995 | |
| JP | 09-213855 | 8/1997 | |

* cited by examiner

Primary Examiner—Jasmine J B Clark
(74) Attorney, Agent, or Firm—Merchant & Gould P.C.

(57) ABSTRACT

The present invention relates to an electronic component formed of an electrically conductive plate and including a plurality of leads 1, 2 each having an island 10 for mounting of a semiconductor chip 3 or having a connecting portion 20 for connection with a wire 4. According to an electronic component X offered by the present invention, at least a set of mutually adjacent leads 1, 2 have their respective mutually facing side surfaces 10a, 20a made non-parallel to each other. Preferably, at least one side surface 20a (10a) of the leads 1, 2 is at least partially curved, folded and/or slanted.

7 Claims, 11 Drawing Sheets

FIG.3
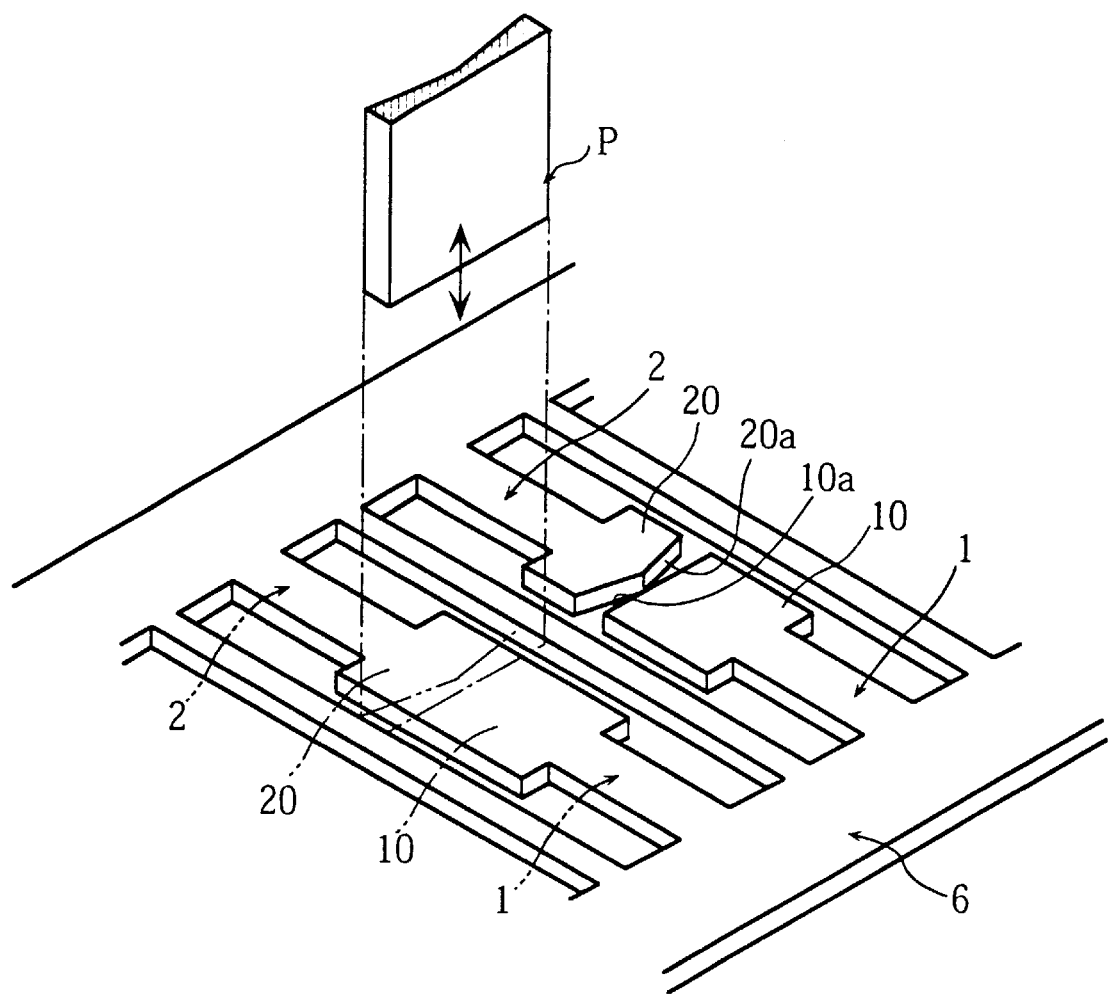
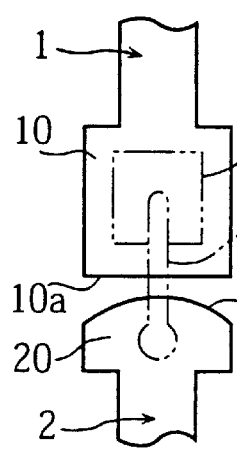
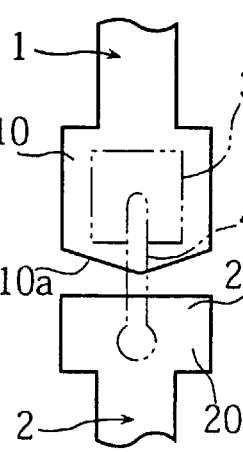
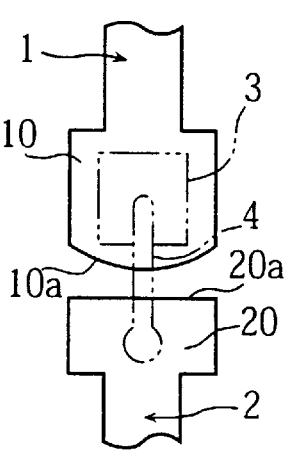
FIG.4A  FIG.4B  FIG.4C

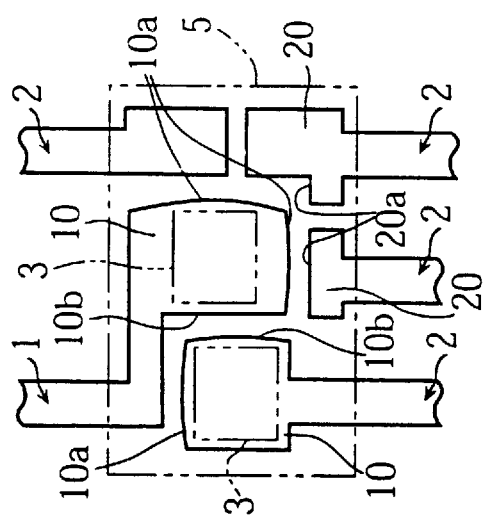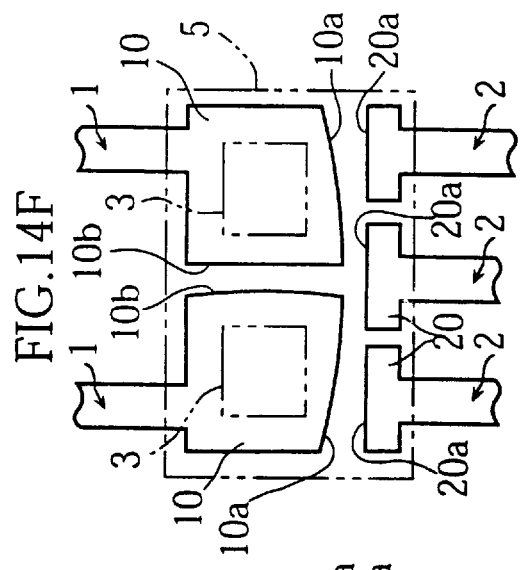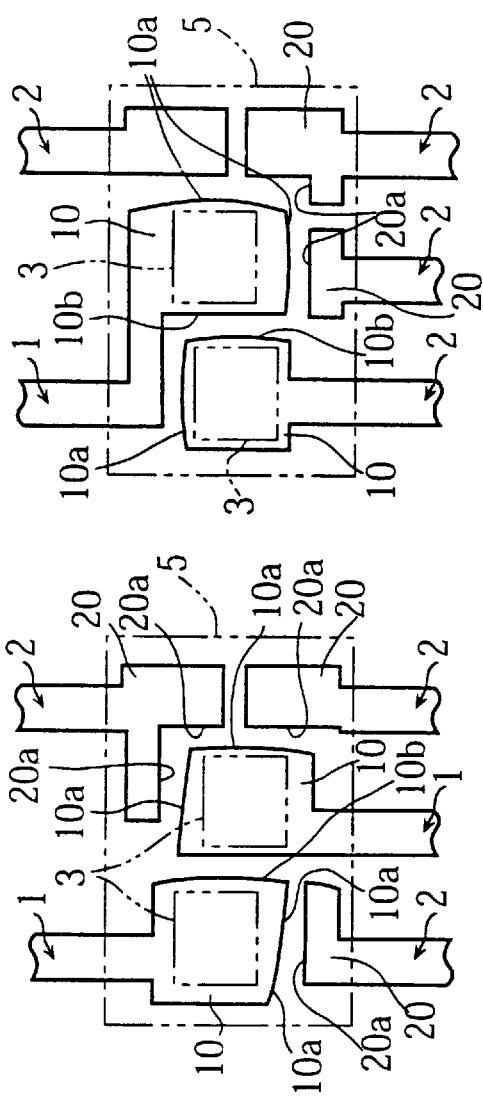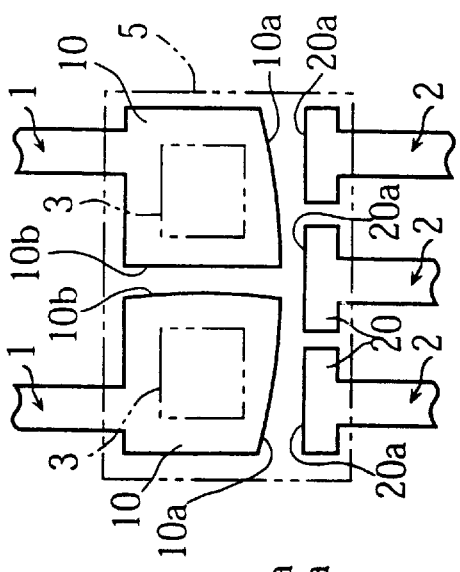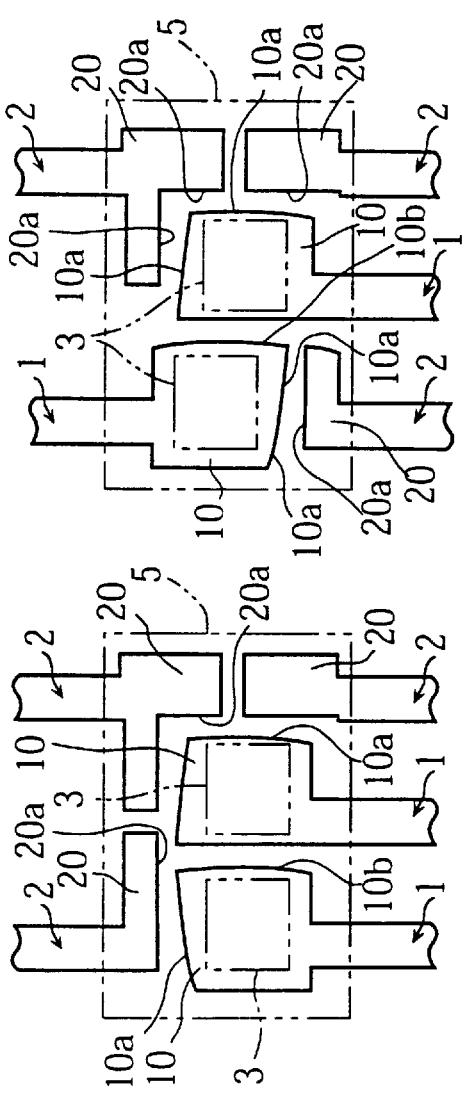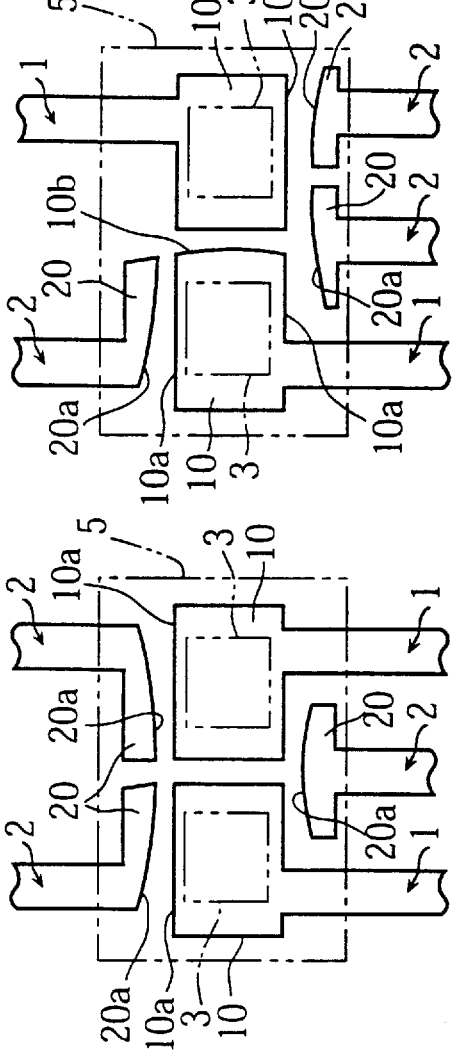

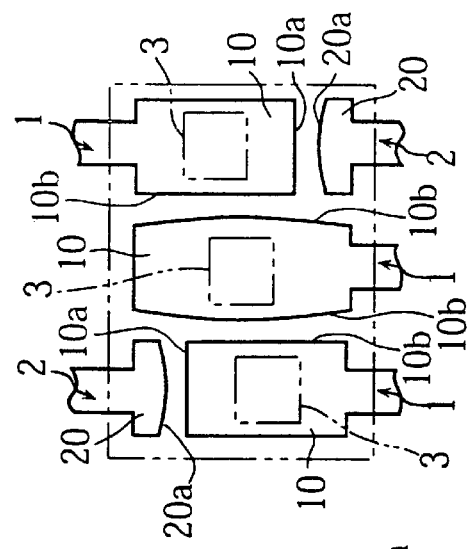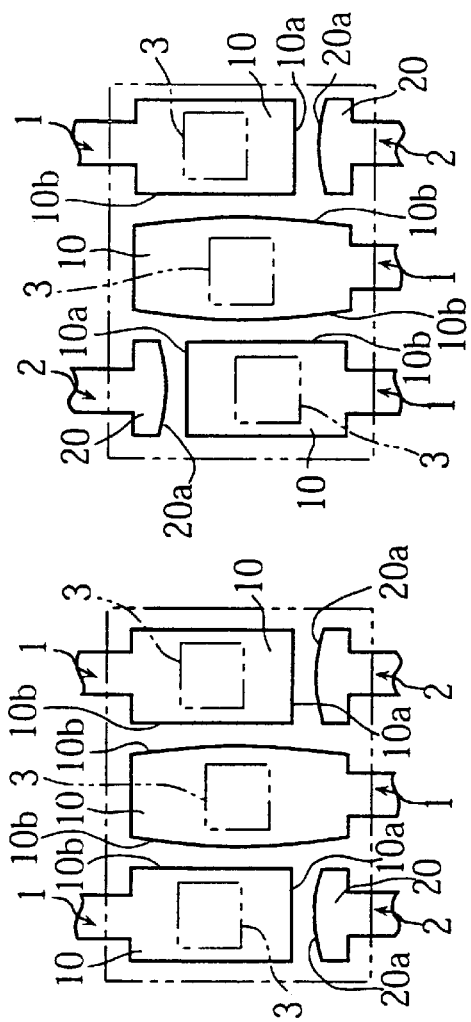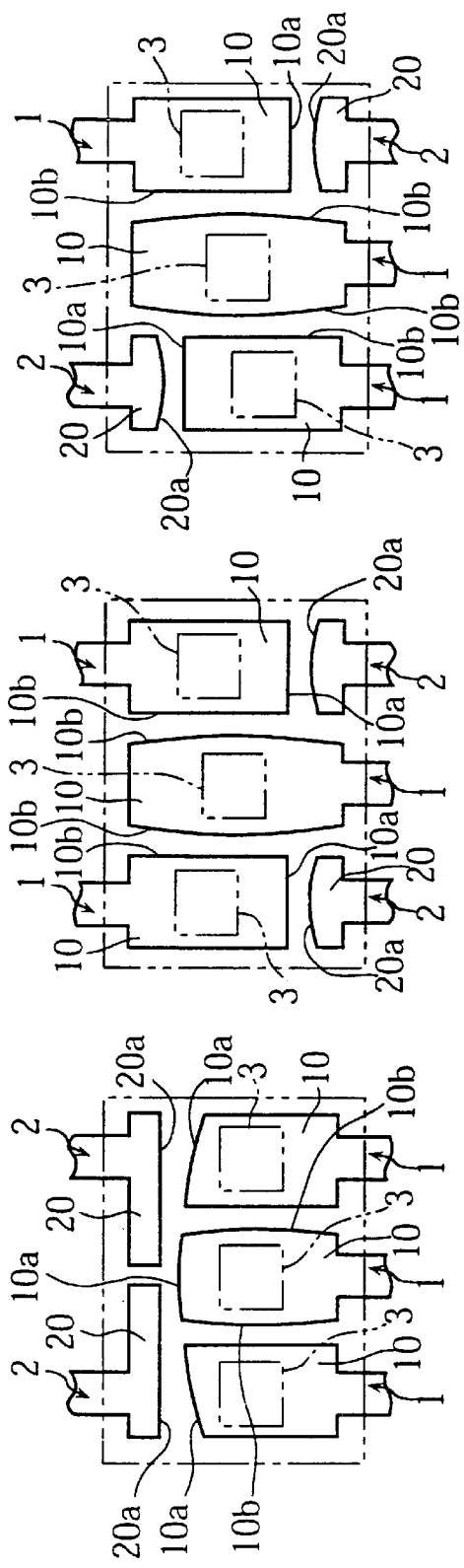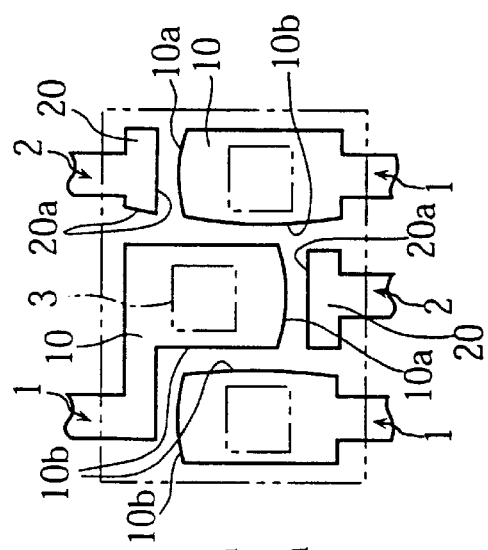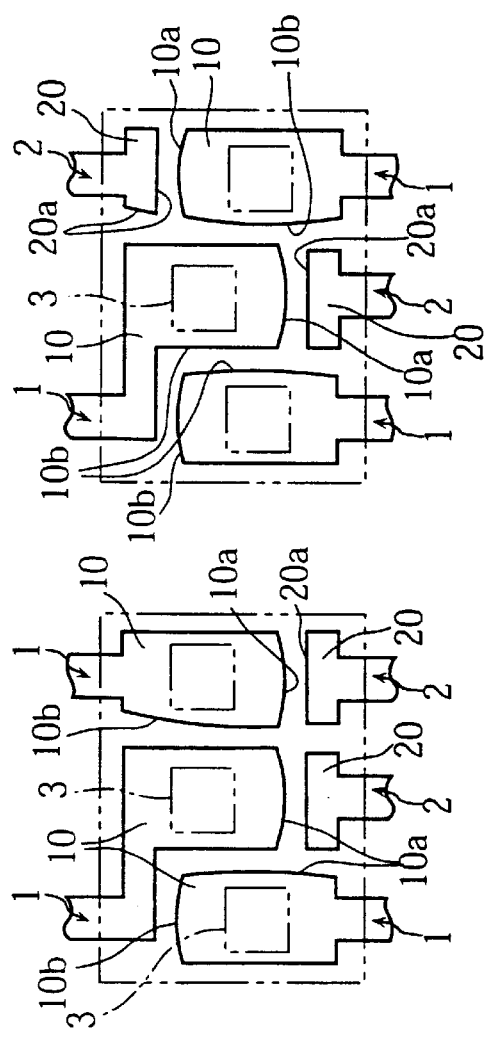

ELECTRONIC PART

TECHNICAL FIELD

The present invention relates to an electronic component made of an electrically conductive plate and including a plurality of leads formed with an island for mounting of a semiconductor chip or formed with a connecting portion for connection with a wire. Such an electronic component serves as e.g. a diode, a transistor, or a combination of these.

BACKGROUND ART

As an example of the electronic component, FIG. 17 and FIG. 18 show a two-terminal electronic component Y, which serves as a diode. The electronic component Y includes a first lead 7 formed with an island 70, and a second lead 8 formed with a connecting portion 80. These leads 7, 8 are opposed to each other so that their respective end surfaces 70a, 80a face in parallel to each other. The island 70 is mounted with a semiconductor chip 9. The semiconductor chip 9 has an upper surface electrode 90 electrically connected with the connecting portion 80 via a wire 91. With the above structure, the semiconductor chip 9, the wire 91, the island 70 and the connecting portion 80 are entirely sealed in a resin package 92. Each of the leads 7, 8 extends out of the resin package 92. These extensions 71, 81 serve as outer connection terminals. More specifically, as shown in FIG. 18, the extensions 71, 81 are respectively bent into cranklike shapes, so that their respective tips 71a, 81a are flush with a bottom surface 92a of the resin package 92. Alternatively, the extensions 71, 81 are bent as shown in phantom lines in the figure. In each case, the tips 71a, 81a of the extensions 71, 81 serve as connecting portions with e.g. a circuit substrate.

Now, with such a structure of the electronic component Y, in view of miniaturizing the electronic component Y, it is necessary to decrease the area of the island 70 and the connecting portion 80. On the other hand, the size of the semiconductor chip 9 mounted on the island 70 is largely determined by the kind of electronic component Y to be manufactured, which substantially limits the extent of area reduction of the island 70. Likewise, the connecting portion 80 to which the wire 91 is connected has to allow for a certain minimum area, which substantially limits the extent of area reduction. As a result, in order to reduce the size of the electronic component Y, it is necessary to decrease a distance between the island 70 and the connecting portion 80, i.e. a distance between the end surfaces 70a, 80a of the leads 7, 8.

However, according to the electronic component Y, the leads 7, 8 are electrically connected with each other, and their respective end surfaces 70a, 80a are faced in parallel to each other. Thus, if the distance between the end surfaces 70a, 80a is decreased, the gap between these end surfaces 70a, 80a functions as a capacitor. Moreover, the smaller is the distance between the end surfaces 70a, 80a, the greater is the electric charge held in the gap, leading to a problem that the electronic component Y cannot be used in a high frequency circuit.

There is another problem. Specifically, each of the leads 7, 8 of the electronic component Y shown in FIG. 17 and FIG. 18 is made from a leadframe. This leadframe is formed, as shown in FIG. 19A for example, by first punching the first and the second lead 7, 8 as a mutually connected single piece, using a metal die P1 of a predetermined punching pattern. Next, as shown in FIG. 19B, another metal die (blade) P2 is used to punch out the gap between the leads 7, 8. Therefore, in order to decrease the gap between the end surfaces 70a, 80a of the leads 7, 8, the blade P2 must have a decreased thickness. However, if the distance between the leads 7, 8 is to be decreased, the blade P2 for forming the leadframe becomes susceptible to fracture or chipping, reducing the life of the blade P2 and resulting in disadvantage not only in cost but also in manufacturing efficiency in that the blade P2 must be replaced frequently.

The present invention is made under the above circumstances, and it is therefore an object of the present invention to provide an electronic component which can be made advantageously not only in terms of manufacturing cost but also in terms of manufacturing efficiency, and which is miniaturized yet appropriate for use in a high frequency circuit.

DISCLOSURE OF THE INVENTION

An electronic component provided by the present invention is formed of an electrically conductive plate, includes a plurality of leads each including an island for mounting of a semiconductor chip or including a connecting portion for connection with a wire, and is characterized in that at least a set of mutually adjacent leads have their respective mutually facing side surfaces made non-parallel to each other.

According to this arrangement, the mutually facing side surfaces of the above set of leads are non-parallel to each other, which means the distance between the side surfaces is larger at a certain location and smaller at a certain location. Therefore, even if the leads are brought closer to each other as a whole for the sake of size reduction of the electronic component, the distance between the side surfaces is larger for a certain length. Thus, it becomes possible to accordingly reduce electrostatic capacity between the leads. As a result, the electronic component according to the present invention can be used appropriately even in a high frequency circuit.

Further, even if each lead is formed by punching out an electrically conductive plate, if there is a region having the large distance between the mutually adjacent leads, then the punch (blade) can be given a large thickness in a portion corresponding to the region having the large distance. This enables to reduce fracture and chipping of the blade, leading to an increased life of the blade and improved cost of manufacture.

In order to make a non-parallel arrangement between the mutually facing side surfaces in the set of mutually adjacent leads, at least one side surface of the set of leads can be at least partially curved, folded and/or slanted. Further, as anticipated from that the mutually facing side surfaces may include a folded surface, the term "side surface" implies that the side surface may include not only one surface but also a plurality of continuous surfaces.

According to a preferred embodiment, one lead of the set has the island and the other lead of the set has the connecting portion. Further, the mutually facing side surfaces in the set of leads maybe crossed by a wire which bridges these leads.

The problem that the gap between mutually facing side surfaces functions as a capacitor is not unique to an electronic component including one lead having an island and another lead having a connecting portion. Rather, the problem is common to other electronic components having three or more terminals in which there is a plurality of leads of one or both kinds. In this type of electronic component, the electric charge tends to accumulate between mutually adjacent leads which are electrically connected together. Therefore, the non-parallel arrangement should be provided between leads where the island and the connecting portion are adjacent to each other, or between leads which are connected with each other via a wire, in order to avoid the above-described problem more effectively.

The technical concept of the present invention is applicable to a variety of electronic components having leads made from a leadframe, and particularly applied suitably to an electronic component serving as a diode, a transistor or a combination of these.

According to a preferred embodiment, the set of leads includes at least three leads, and the side surface of one of the leads faces the respective side surfaces of the other leads.

BRIEF DESCRIPTION OF THE DRAWINGS

FIG. 3 is a perspective view showing a principal portion, for illustrating a forming process of a leadframe used in manufacture of the two-terminal electronic component shown in FIGS. 1 and 2.

FIG. 4 is a plan view showing a principal portion of another embodiment of the two-terminal electronic component according to the present invention.

FIG. 14 is a plan view showing a principal portion of another embodiment of the five-terminal electronic component according to the present invention.

FIG. 15 is a plan view showing a principal portion of still another embodiment of the five-terminal electronic component according to the present invention.

BEST MODE FOR CARRYING OUT THE INVENTION

Hereinafter, preferred embodiments of the present invention will be described specifically, with reference to the drawings.

Figure 1:
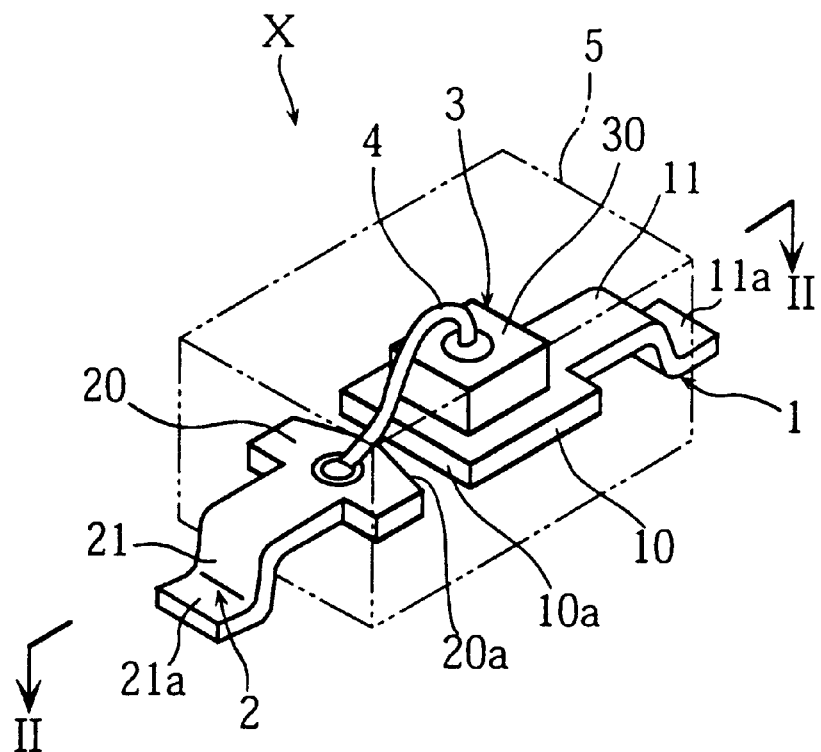
FIG. 1 is an overall perspective view of an embodiment of an electronic component according to the present invention.
Figure 2:
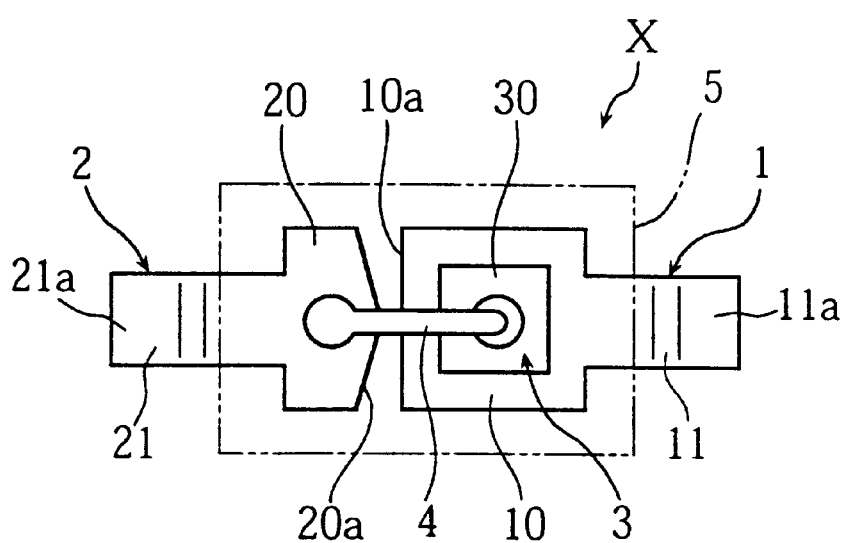
FIG. 2 is a sectional view taken in lines II—II in FIG. 1.

FIG. 1 through FIG. 3 show an electronic component as an embodiment of the present invention. This electronic component X is made as a diode, and includes a first lead 1 having an island 10, and a second lead 2 having a connecting portion 20.

The island 10 is mounted with a semiconductor chip 3. The semiconductor chip 3 has an upper surface electrode 30 electrically connected with the connecting portion 20 via a wire 4. The island 10, the connecting portion 20, the semiconductor chip 3 and the wire 4 are sealed by a resin package 5.

Each of the leads 1, 2 has a portion extending out of the resin package 5. These extensions 11, 21 are respectively bent into crank-like shapes, so that their respective tips 11a, 21a are flush with a bottom surface of the resin package 5.

The island 10 and the connecting portion 20 are opposed to each other, but their respective opposing side surfaces 10a, 20a are not in parallel to each other. More specifically, the side surface 10a of the island 10 is a flat surface, whereas the side surface 20a of the connecting portion 20 is a triangular, non-flat surface, i.e. like a two-fold surface including two flat surfaces. Therefore, the apex of the triangular side surface 20a represents the closest point to the side surface 10a of the island 10, and the distance between the side surfaces 10a, 20a grows larger toward respective outward ends.

According to the above arrangement, the island 10 and the connecting portion 20 are placed close to each other as a whole, thereby achieving the size reduction of the electronic component X, yet the distance between the side surface 10a, 20a increases toward the respective outward ends, enabling to reduce an amount of electric charge held between the side surfaces 10a, 20a. In particular, the gap between the side surface 10a, 20a is crossed by the wire 4 which serves as an electrical path, and is inherently prone to electric charging. Therefore, it is advantageous to provide such an arrangement in which the gap between the side surfaces 10a, 20a is not prone to electric charge. As has been described, the electronic component X according to the present embodiment does not easily hold electric charge between the leads 1, 2, and therefore can be used appropriately even in a high frequency circuit.

The electronic component x described above is manufactured from a leadframe 6 (See FIG. 3) obtained from an electrically conductive plate. The leadframe 6 is formed by first punching the first and the second lead 1, 2 as a mutually connected single piece (a left-hand portion in FIG. 3), using a metal die (not illustrated) of a predetermined punching pattern. Then, another metal die (blade) P is used to punch out a gap (a region enclosed by phantom lines in the left-hand portion in FIG. 3) between the leads 1, 2 (a right-hand portion in FIG. 3).

According to the leadframe 6 formed in such a way, the smallest distance between the side surface 20a of the connection portion 20 of the second lead 2 and the side surface 10*a* of the first lead 1 is small as ever, yet the distance between the side surfaces 10*a*, 20*a* as a whole is larger than the convention. Therefore, the thickness of the metal die P necessary for the formation of the leadframe 6, i.e. each of the leads 1, 2, can be increased except for a certain part, enabling to reduce fracture and chipping of the metal die, leading to an increased life of the metal die P and improved cost of manufacture.

According to the present embodiment, the side surface 20*a* of the connecting portion 20 of the second lead 2 is formed as a triangular, non-flat surface (a folded surface). Alternatively, the mutually opposed side surfaces 10*a*, 20*a* of the first lead 1 and the second lead 2 may be shaped as shown in FIG. 4 through FIG. 9, for achieving a non-parallel arrangement. Any of these arrangements provides the advantage same as described above.

FIG. 4A shows a case in which the side surface 20*a* of the connecting portion 20 of the second lead 2 is formed like a convex arc (curved surface). Alternatively, as shown in FIG. 4B, the side surface 10*a* of the die pad 10 of the first lead 1 may be formed as a triangular non-flat surface, or as shown in FIG. 4C, the side surface 10*a* may be formed like a convex arc to achieve a non-parallel arrangement between the side surfaces 10*a*, 20*a*.

Figure 5A:
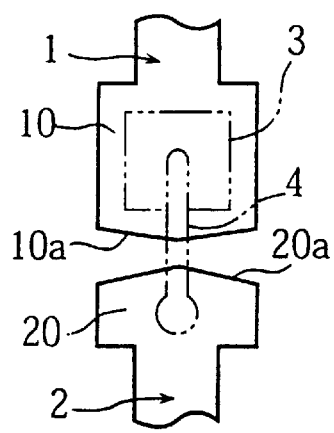
FIG. 5 is a plan view showing a principal portion of still another embodiment of the two-terminal electronic component according to the present invention.
Figure 5B:
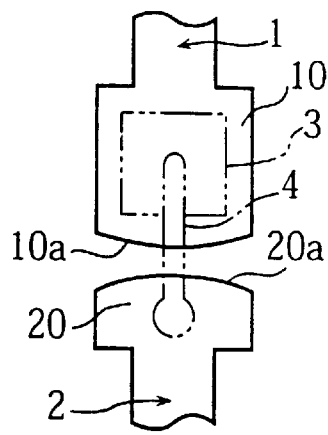

FIG. 5A and FIG. 5B show embodiments in which both of the mutually opposed side surfaces 10*a*, 20*a* of the first and the second leads 1, 2 are formed like the triangular, non-flat surfaces or like the convex arc surfaces, to achieve a non-parallel arrangement between the side surfaces 10*a*, 20*a*. Obviously, though not illustrated, one of the side surfaces 10*a*, 20*a* may be formed like the triangular, non-flat surface, whereas the other is formed like the convex arc surface, to achieve a non-parallel arrangement between the side surfaces 10*a*, 20*a*.

Figure 6A:
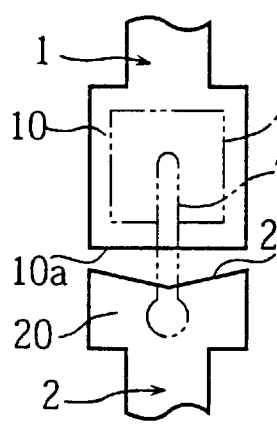
FIG. 6 is a plan view showing a principal portion of still another embodiment of the two-terminal electronic component according to the present invention.
Figure 6B:
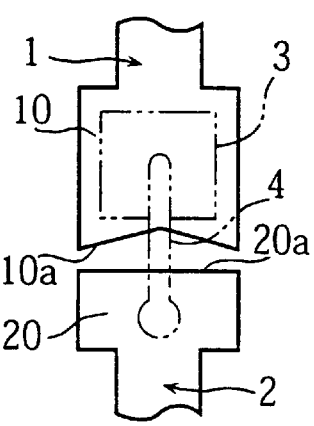
Figure 6C:
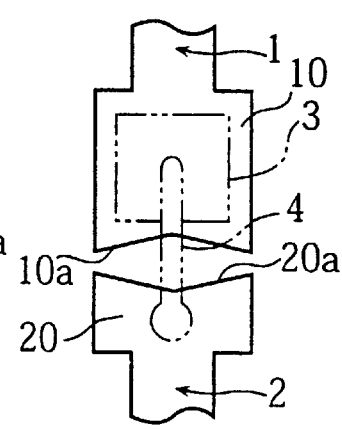

FIG. 6 shows embodiments in which at least one of the side surfaces 10*a*, 20*a* is formed as a V-shaped, recessing and non-flat surface (a folded surface), to achieve a nonparallel arrangement between the side surfaces 10*a*, 20*a*. Specifically, FIG. 6A shows a case in which the side surface 20*a* of the connecting portion 20 is formed into the V-shaped non-flat surface. FIG. 6B shows a case in which the side surface 10*a* of the island 10 is formed into the V-shaped non-flat surface, and FIG. 6C shows a case in which both of the side surfaces 10*a*, 20*a* are formed into the V-shaped non-flat surfaces. Obviously, though not illustrated, at least one of the side surfaces 10*a*, 20*a* may be formed like a concave, arced surface, to achieve a non-parallel arrangement between the side surfaces 10*a*, 20*a*.

Figure 7A:
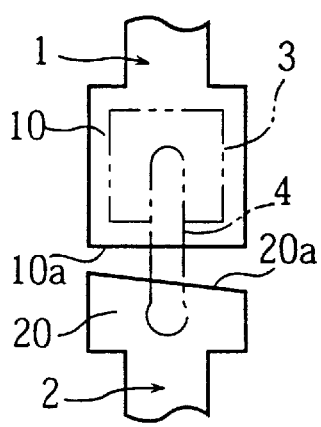
FIG. 7 is a plan view showing a principal portion of still another embodiment of the two-terminal electronic component according to the present invention.
Figure 7B:
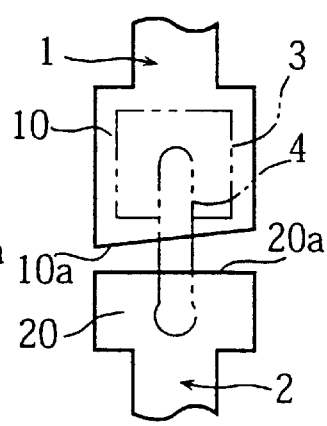
Figure 7C:
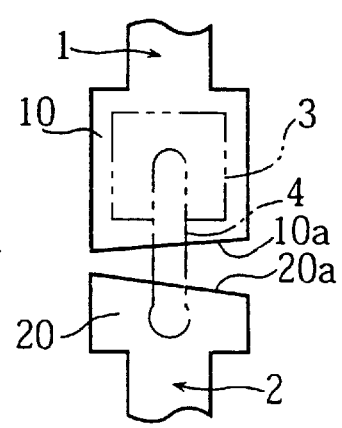

FIG. 7 shows embodiments in which at least one of the side surfaces 10*a*, 20*a* is formed as a slanted surface to achieve a non-parallel arrangement between the side surfaces 10*a*, 20*a*. Specifically, FIG. 7A shows a case in which the side surface 20*a* of the connecting portion 20 is slanted with respect to the side surface 10*a* of the island 10. FIG. 7B shows a case in which the side surface 10*a* of the island 10 is slanted with respect to the side surface 20*a* of the connecting portion 20, and FIG. 7C shows a case in which both of the side surfaces 10*a*, 20*a* are slanted.

Figure 8A:
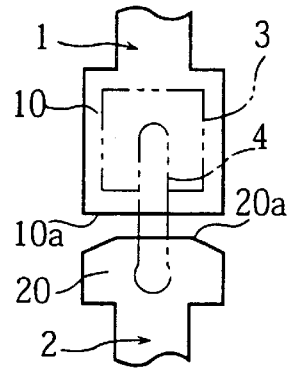
FIG. 8 is a plan view showing a principal portion of still another embodiment of the two-terminal electronic component according to the present invention.
Figure 8B:
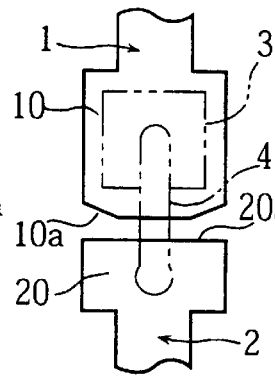
Figure 8C:
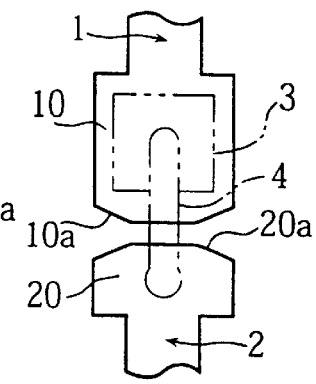

FIG. 8 shows embodiments in which at least one of the side surfaces 10*a*, 20*a* is formed trapezoidal, i.e. with two widthwise sides being slanted and the intermediate portion being horizontal to achieve a non-parallel arrangement between the side surfaces 10*a*, 20*a*. Specifically, FIG. 8A shows a case in which the side surface 20*a* of the connecting portion 20 is formed trapezoidal. FIG. 8B shows a case in which the side surface 10*a* of the island 10 is formed trapezoidal, and FIG. 8C shows a case in which both of the side surfaces 10*a*, 20*a* are formed trapezoidal.

Figure 9A:
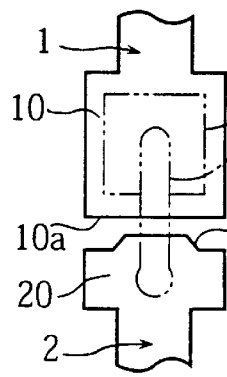
FIG. 9 is a plan view showing a principal portion of still another embodiment of the two-terminal electronic component according to the present invention.
Figure 9B:
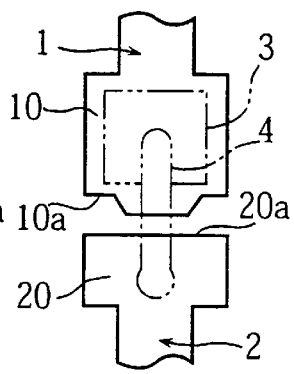
Figure 9C:
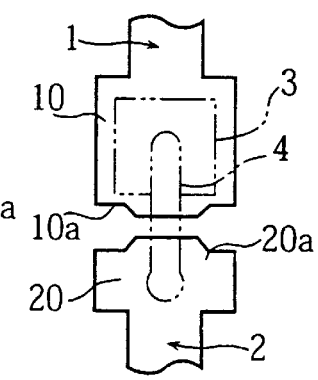

FIG. 9 shows embodiments in which at least one of the side surfaces 10*a*, 20*a* has its central portion projected as a stepped or a trapezoidal shape to achieve a non-parallel arrangement between the side surfaces 10*a*, 20*a*. Specifically, FIG. 9A shows a case in which the side surface 20*a* of the connecting portion 20 is stepped. FIG. 9B shows a case in which the side surface 10*a* of the island 10 is stepped, and FIG. 9C shows a case in which both of the side surfaces 10*a*, 20*a* are stepped.

The embodiments described above are for electronic components classified as two-terminal parts (such as a diode). The technical concept of the present invention is also applicable to electronic components having three or more terminals. Hereinafter, FIG. 10 through FIG. 16 show embodiments in which the present invention is applied to electronic components having three to five terminals.

Figure 10A:
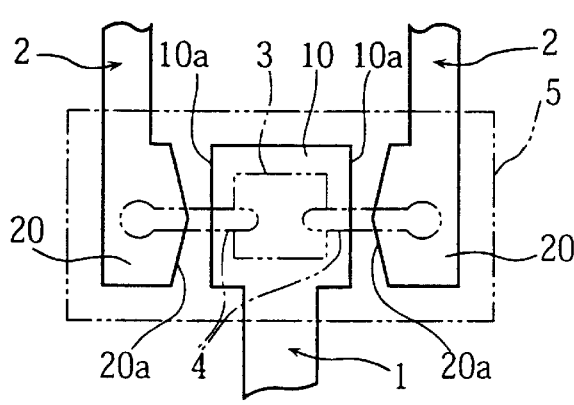
FIG. 10 is a plan view showing a principal portion of an embodiment of the present invention as an application to a three-terminal electronic component.
Figure 10B:
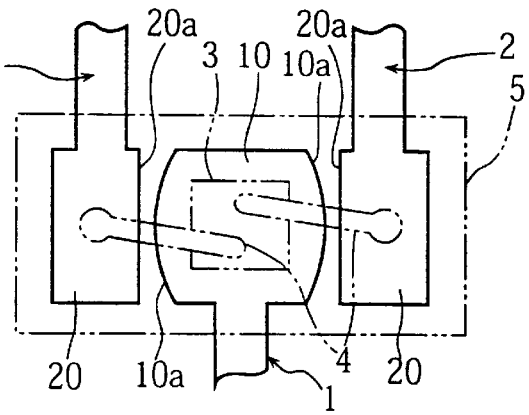

FIG. 10 shows a principal portion of an electronic component including a first lead 1 having an island 10 and two second leads 2 each having a connecting portion 20. According to this electronic component, the island 10 is between the two connecting portions 20. Specifically, FIG. 10A shows a case in which each connecting portion 20 has its side surface 20*a* facing respective one of the side surfaces 10*a* of the island 10 formed as a triangular, non-flat surface. On the other hand, FIG. 10B shows a case in which each of the respective side surfaces 10*a* of the island 10 facing a corresponding side surface 20*a* of the connecting portion is formed as a convex surface.

Figure 11A:
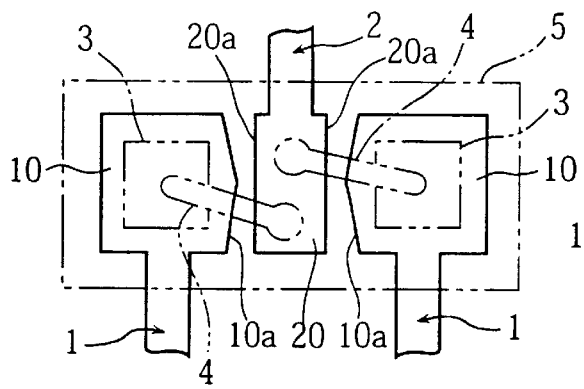
FIG. 11 is a plan view showing a principal portion of another embodiment of the three-terminal electronic component according to the present invention.
Figure 11B:
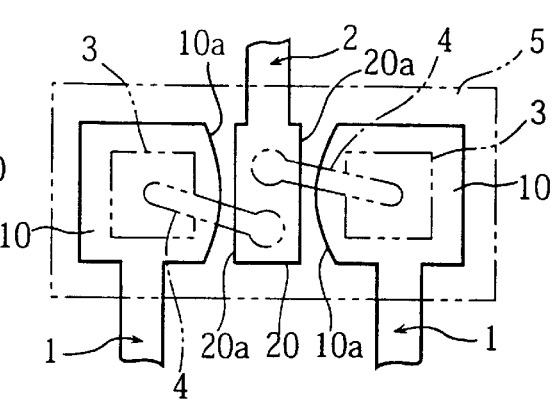

FIG. 11 shows a principal portion of an electronic component including one second lead 2 having a connecting portion 20 and two first leads 1 each having an island 10. According to this electronic component, the connecting portion 20 is between the two islands 10. Specifically, FIG. 11A shows a case in which each island 10 has its side surface 10*a* facing respective one of the side surfaces 20*a* of the connecting portion 20 formed as a triangular, non-flat surface. On the other hand, FIG. 11B shows a case in which each of the side surfaces 10*a* of the island 10 is formed as a convex surface.

FIG. 10 and FIG. 11 cover cases in which the side surfaces 10*a* of the island 10 or the side surfaces 20*a* of the connecting portion(s) are formed as triangular, non-flat-surfaces or convex surfaces. Alternatively, the side surfaces 10*a*, 20*a* of both elements may be made as folded or convex surfaces. Further, the side surfaces 10*a*, 20*a* may be shaped as already described with reference to FIG. 6 through FIG. 9, i.e. the shape of V, concave, trapezoidal, stepped or even others.

FIG. 12 shows embodiments, in each of which the present invention is applied to an electronic component having four terminals.

Figure 12A:
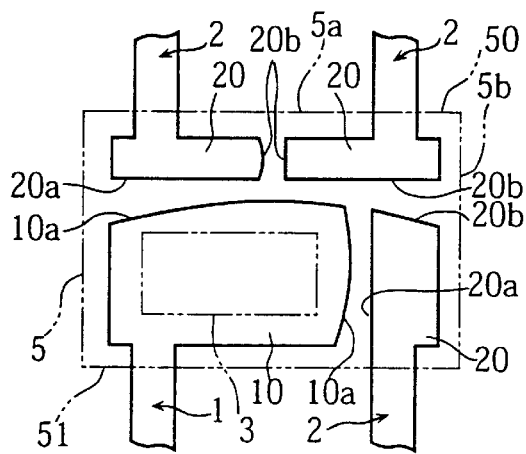
FIG. 12 is a plan view showing a principal portion of an embodiment of the present invention as an application to a four-terminal electronic component.

FIG. 12A shows an embodiment in which the present invention is applied to an electronic component which includes one first lead 1 and three second leads 2. According to this electronic component, the three connecting portions 20 are disposed along two sides 5*a*, 5*b* which define a corner 50 of a resin package 5. The island 10 is placed to occupy a central region and a corner 51 which is diagonal with respect to the corner 50. In this layout, the island 10 has two arced side surfaces 10*a* each facing a side surface 20*a* of one of the connecting portions 20. Further, according to the present invention, not only between the mutually facing side surfaces 10*a*, 20*a* of the first and the second leads 1, 2, but also between mutually facing side surfaces 20b of the second leads 2, one of such side surfaces is arced or slanted to achieve a non-parallel arrangement between the side surfaces 20b of the second leads 2.

Figure 12B:
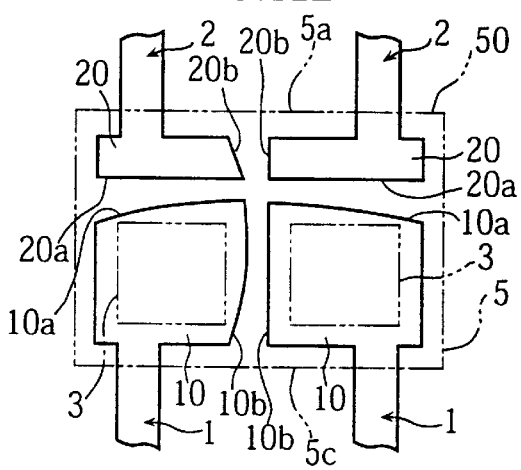

FIG. 12B shows an embodiment in which the present invention is applied to an electronic component including two first leads 1 and two second leads 2. According to this embodiment, the two connecting portions 20 of the respective second leads 2 are disposed along a side 5a of a resin package 5. The islands 10 of the respective first leads 1 are placed to occupy a central region and a side 5c which is a side facing away from the side 5a. With this layout, each island 10 has an arced side surface 10a facing a side surface 20a of the corresponding connecting portion 20. Further, between the mutually facing side surfaces 10b of the two islands 10, one of the islands 10 has its side surface 10b arced. Thus, according to the electronic component offered by the present embodiment, mutually facing side surfaces 10b of mutually adjacent islands 10 are also made non-parallel to each other.

Figure 12C:
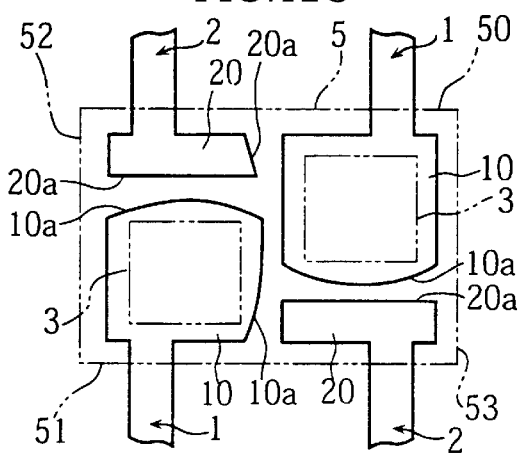

FIG. 12C shows an embodiment similar to the one shown in FIG. 12B, i.e. the present invention is applied to an electronic component including two first leads 1 and two second leads 2. In this embodiment, the two islands 10 of the respective first leads 1 are disposed respectively at one of mutually diagonal corners 50, 51 of a resin package 5. The connecting portions 20 of the second leads 2 are placed respectively at the remaining corners 52, 53. According to this arrangement again, an appropriate one of mutually facing side surfaces 10a, 20 of the mutually adjacent first and the second leads 1, 2 is arced or slanted so as to be non-parallel to each other.

Figure 12D:
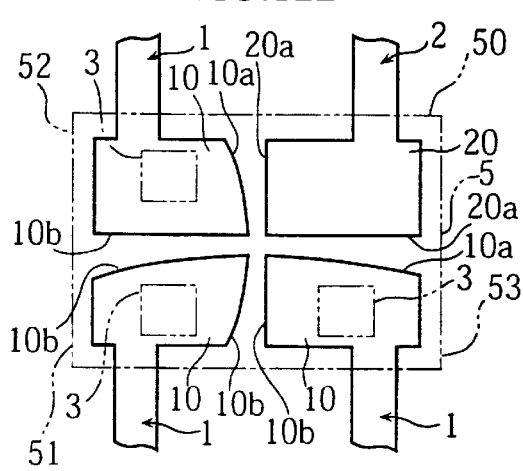

FIG. 12D shows an embodiment in which the present invention is applied to an electronic component including three first leads 1 and one second lead 2. According to this electronic component, each of the leads 1, 2 is disposed at one of the four corners 50–53 of a resin package 5. Appropriate ones of mutually facing side surfaces 10a, 10b, and 20a of the mutually adjacent leads 1, 2 are arced to achieve non-parallel arrangement between mutually facing side surfaces of the islands 10 and the connecting portions 20.

Obviously, in the four-terminal electronic component, too, the shape of mutually facing side surfaces 10a, 10b, 20a, 20b maybe other than shown in FIGS. 12A–12D so long as mutually facing leads 1, 2 are made non-parallel to each other.

FIG. 13 through FIG. 16 show embodiments, in each of which the present invention is applied to an electronic component having five terminals.

Figure 13A:
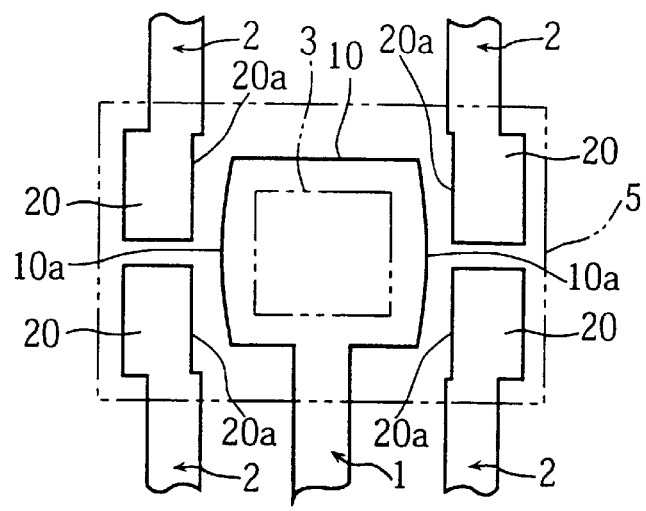
FIG. 13 is a plan view showing a principal portion of an embodiment of the present invention as an application to a five-terminal electronic component.
Figure 13B:
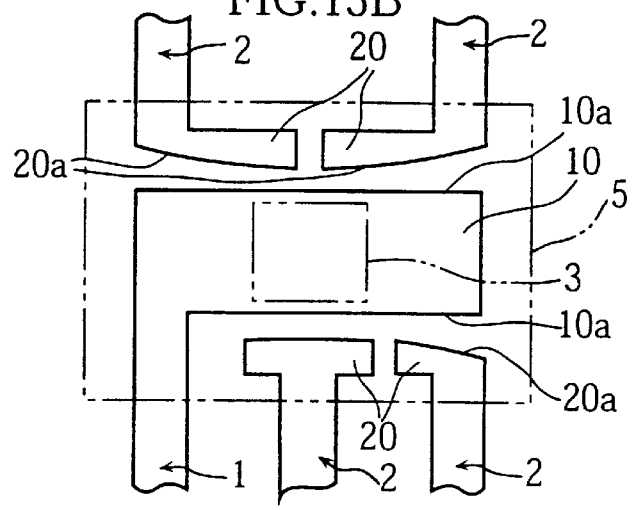
Figure 13C:
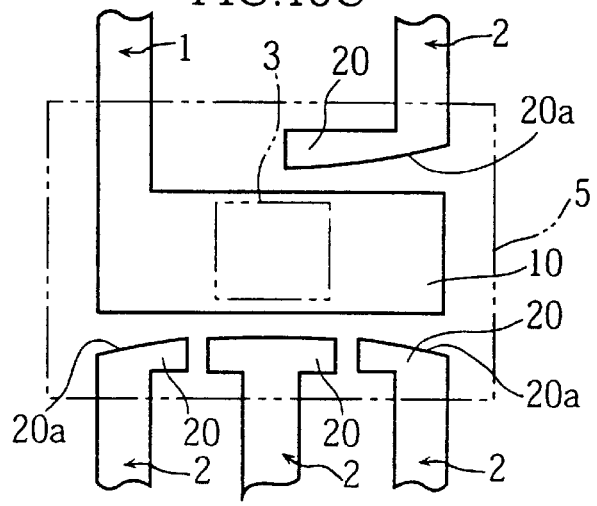

FIG. 13A–FIG. 13C show electronic components each having one island 10 at a central region of a resin package 5 and four connecting portions 20 around the island 10. According to these embodiments, either the island 10 or the connecting portions 20 have their respective appropriate side surfaces 10a, 20a arced, to achieve a non-parallel relationship of the side surfaces 10a of the island 10 with respect to opposing side surfaces 20a.

Figure 16A:
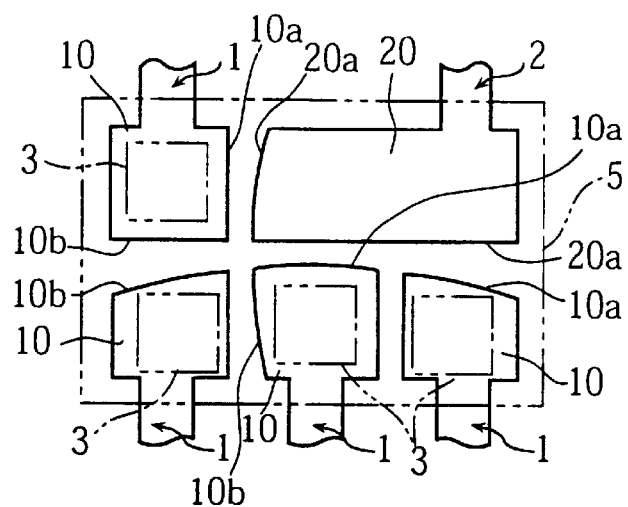
FIG. 16 is a plan view showing a principal portion of still another embodiment of the five-terminal electronic component according to the present invention.
Figure 16B:
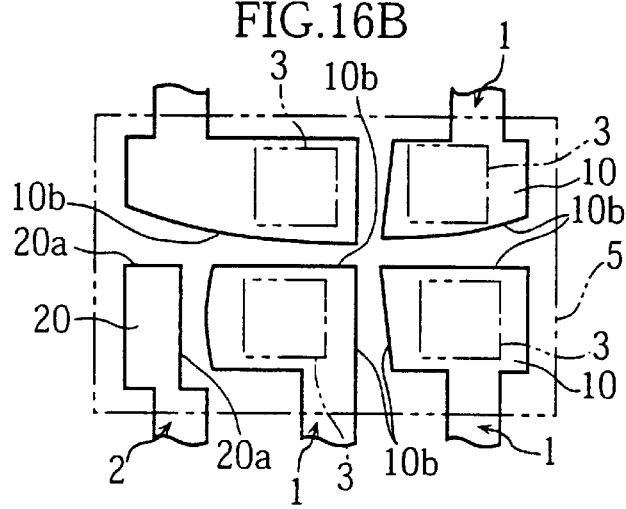
Figure 16C:
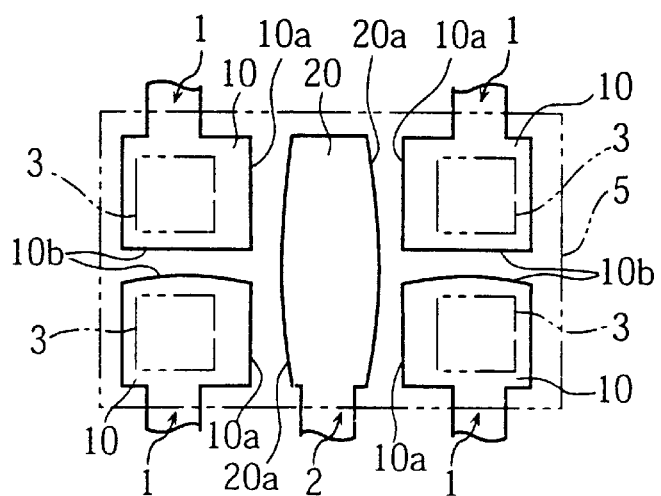
Figure 17:
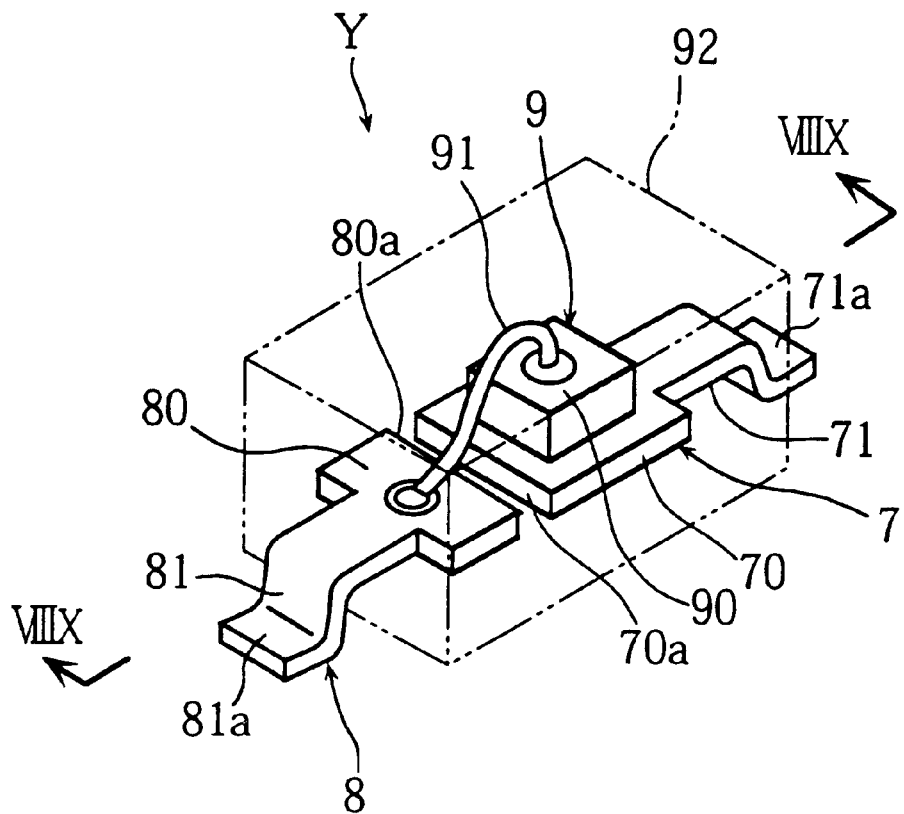
FIG. 17 is an overall perspective view showing a conventional two-terminal electronic component.
Figure 18:
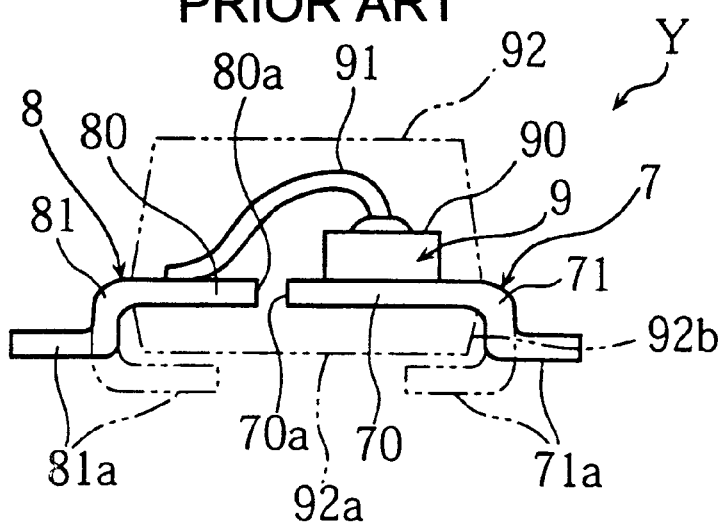
FIG. 18 is a sectional view taken in lines VIIIX—VIIIX in FIG. 17.
Figure 19A:
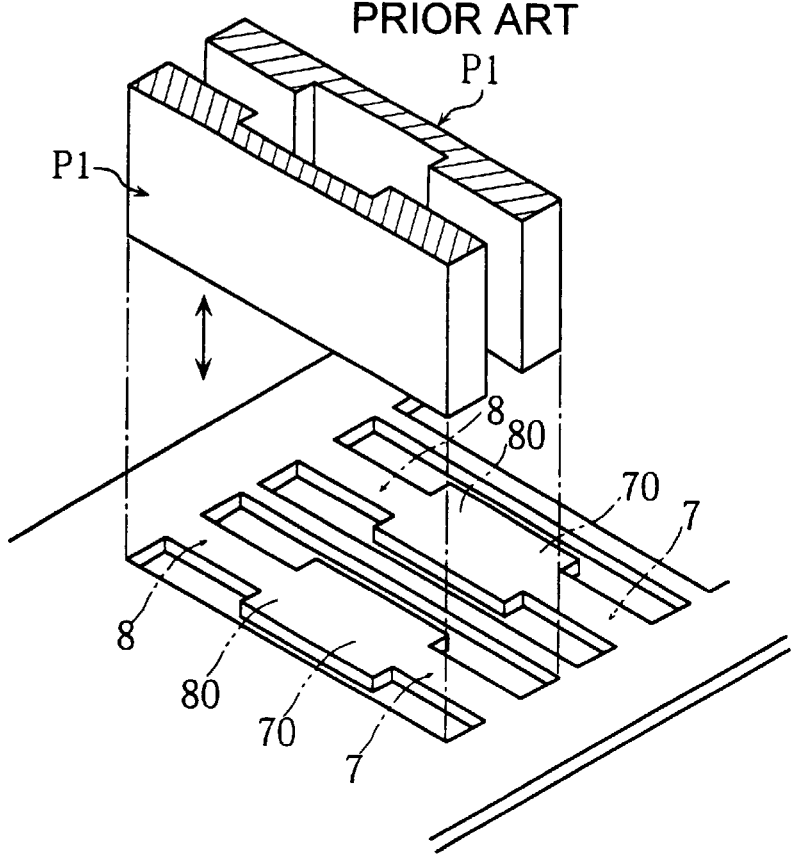
FIG. 19 is a perspective view showing a principal portion, for illustrating a forming process of a leadframe used in manufacture of the conventional electronic component.
Figure 19B:
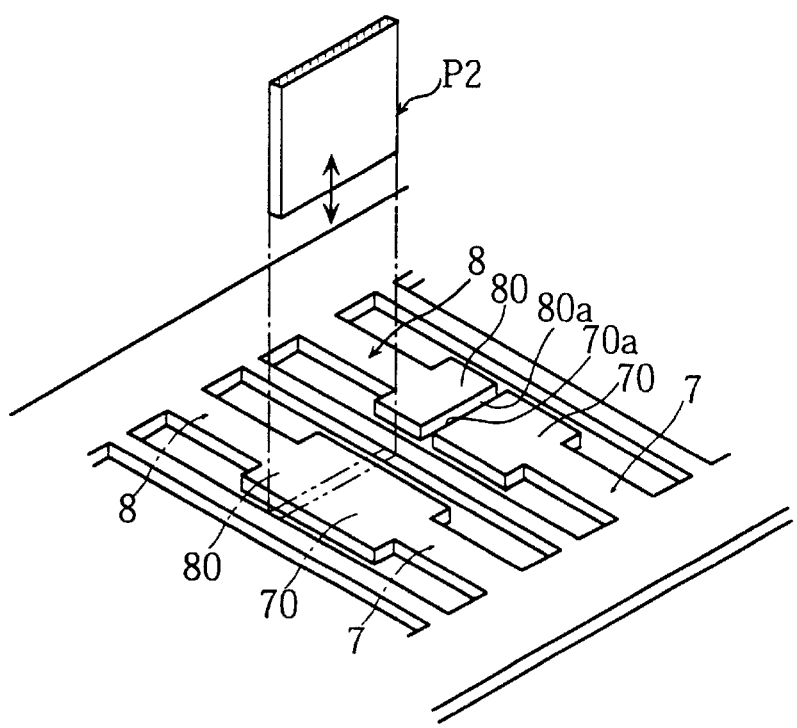

FIG. 14A through FIG. 14F show embodiments, in each of which the present invention is applied to an electronic component having two first leads 1 and three second leads 2. FIG. 15A through FIG. 15E show embodiment, in each of which the present invention is applied to an electronic component having three first leads 1 and two second leads 2. FIG. 16A through FIG. 16C show embodiments, in each of which the present invention is applied to an electronic component having four first leads 1 and one second lead 2. In all of these embodiments, mutually adjacent leads 1, 2 have their appropriate one(s) of side surfaces 10a, 10b, 20a, 20b arced or slanted.

Obviously, in the five-terminal electronic component, too, the shape of mutually facing side surfaces 10a, 10b, 20a, 20b may be other than shown in FIGS. 13 through FIG. 16 so long as mutually facing leads 1, 2 are non-parallel to each other.

Further, the technical concept of the present invention is applicable also to an electronic component having six or more terminals, and even to electronic component having not more than five terminals which are not shown in FIG. 1 through FIG. 16.

What is claimed is:

1. An electronic part formed of an electrically conductive plate, comprising a plurality of leads each including, an island for mounting of a semiconductor chip or including a connecting portion for connection with a wire,
   wherein at least a pair of mutually adjacent leads have their respective mutually facing side surfaces made non-parallel to each other, a distance between the two side surfaces at least partially changing gradually.

2. The electronic part according to claim 1, wherein at least one side surface of the pair is at least partially curved, folded and/or slanted.

3. The electronic part according to claim 1, wherein one lead of said at least one pair has the island and the other lead of the pair has the connecting portion.

4. The electronic part according to claim 1, wherein the mutually facing side surfaces in said at least one pair are crossed by a wire which bridges these leads.

5. The electronic part according to claim 1, serving as a diode, a transistor or a combination of these.

6. The electronic part according to claim 1, wherein the plurality of leads include at least three leads including at least two pairs of mutually facing side surfaces, each of said at least two pairs having their respective mutually facing side surfaces made non-parallel to each other, a distance between the two side surfaces at least partially changing gradually.

7. An electronic part formed of an electrically conductive plate, the part comprising first, second and third leads, the first lead including an island for mounting a semiconductor chip, the island having a first side surface, the second lead including a connecting portion having a second side surface, the third lead including a connecting portion having a third side surface,
   wherein the second and the third side surfaces arc held in facing relation to the first side surface, each of the second and third side surfaces being non-parallel to the first side surface.

* * * * *